(12) United States Patent
Yoshida et al.

(10) Patent No.: US 7,429,799 B1
(45) Date of Patent: Sep. 30, 2008

(54) LAND PATTERNS FOR A SEMICONDUCTOR STACKING STRUCTURE AND METHOD THEREFOR

(75) Inventors: Akito Yoshida, Chandler, AZ (US); Mahmoud Dreiza, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 308 days.

(21) Appl. No.: 11/190,596

(22) Filed: Jul. 27, 2005

(51) Int. Cl.
*H01L 23/48* (2006.01)
*H01L 23/28* (2006.01)

(52) U.S. Cl. .................. 257/783; 257/787; 257/773; 257/786; 257/E23.116

(58) Field of Classification Search .......... 257/783, 257/787, 773, 786, E23.116
See application file for complete search history.

(56) References Cited

U.S. PATENT DOCUMENTS

| | | | |
|---|---|---|---|
| 5,808,873 A | 9/1998 | Celaya et al. | |
| 5,844,168 A * | 12/1998 | Schueller et al. | ............ 174/558 |
| 5,989,940 A | 11/1999 | Nakajima | |
| 6,060,778 A | 5/2000 | Jeong et al. | |
| 6,181,016 B1 * | 1/2001 | Lin et al. | ............... 257/786 |
| 6,201,305 B1 | 3/2001 | Darveaux et al. | |
| 6,395,579 B2 | 5/2002 | Tandy et al. | |
| 6,451,625 B1 | 9/2002 | Pu et al. | |
| 6,521,980 B1 | 2/2003 | Tandy et al. | |
| 6,660,588 B1 | 12/2003 | Yang et al. | |
| 6,673,656 B2 | 1/2004 | Chung | |
| 6,692,988 B2 | 2/2004 | Fang et al. | |
| 6,746,895 B2 | 6/2004 | Bolken et al. | |
| 6,828,687 B2 | 12/2004 | Ding | |
| 6,833,614 B2 | 12/2004 | Higuchi | |
| 6,987,314 B1 * | 1/2006 | Yoshida et al. | ............... 257/698 |
| 7,115,981 B2 * | 10/2006 | Grigg | ............... 257/684 |
| 2004/0080027 A1 | 4/2004 | Grigg et al. | |
| 2004/0159946 A1 | 8/2004 | Moxham et al. | |
| 2005/0093152 A1 * | 5/2005 | Fjelstad et al. | ............... 257/738 |

* cited by examiner

*Primary Examiner*—Nitin Parekh
(74) *Attorney, Agent, or Firm*—Weiss & Moy, P.C.

(57) ABSTRACT

A semiconductor device has a substrate and an encapsulation area on a first surface of the substrate. A first plurality of metal lands is on the first surface of the substrate around a periphery of the encapsulation area. Solder mask covers portions of the first plurality of metal lands closest to the encapsulation area. Remaining portions of the first plurality of metal lands are exposed areas having no solder mask.

20 Claims, 4 Drawing Sheets

LAND PATTERNS FOR A SEMICONDUCTOR STACKING STRUCTURE AND METHOD THEREFOR

FIELD OF THE INVENTION

This invention relates to semiconductor devices and, more specifically, to a semiconductor device having land patterns for stacking additional devices which will guard against mold flash while increasing board level reliability.

BACKGROUND OF THE INVENTION

As electronic devices get smaller, the components within these devices must get smaller as well. Because of this, there has been an increased demand for the miniaturization of components and greater packaging density. Integrated Circuit (IC) package density is primarily limited by the area available for die mounting and the height of the package. One way of increasing the density is to stack multiple die or packages vertically in an IC package. Stacking multiple die or packages will maximize function and efficiency of the semiconductor package.

Stacked semiconductor packages are different from regular semiconductor packages in that they have lands on both the top and bottom surfaces of the stacked semiconductor package. A problem may arise on the top side of the stacked semiconductor package as the mold cap/area may encroach on the inner row of the lands. Because of this problem, many stacked semiconductor packages use a solder mask defined land pad opening on the inner row of all land pads. However board level reliability is believed to be proportional to exposed land pad metal area. The use of solder mask defined land pads reduces the amount of exposed land pad metal area and this reduces board level reliability.

Therefore, a need existed to provide a device and method to overcome the above problem.

SUMMARY OF THE INVENTION

A semiconductor device has a substrate and an encapsulation area on a first surface of the substrate. A first plurality of metal lands is on the first surface of the substrate around a periphery of the encapsulation area. Solder mask covers portions of the first plurality of metal lands closest to the encapsulation area. Remaining portions of the first plurality of metal lands are exposed areas having no solder mask.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
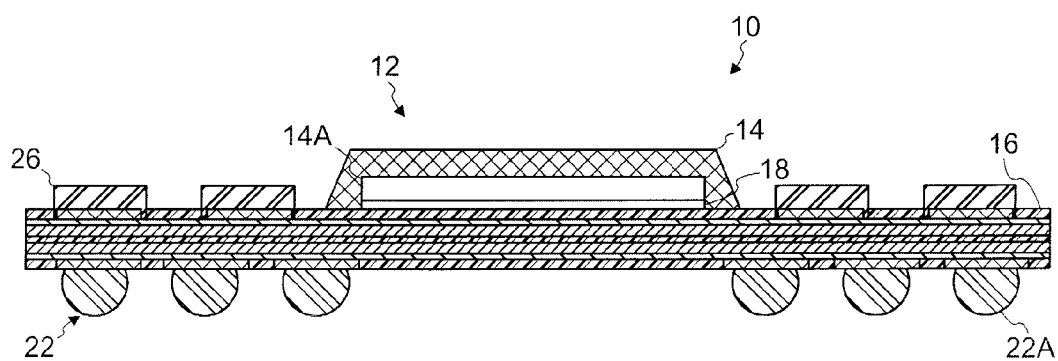
FIG. 1 is a top view of one embodiment of the semiconductor device of the present invention.

Referring to FIG. 1, a semiconductor device 10 is shown. The semiconductor device 10 has a device 12. The device 12 is coupled to a first surface of a substrate 16. The device 12 is encapsulated with a mold compound 14. The device 12 may be any type of device. For example, the device 12 may be a memory device, a logic device, an ASIC device, and other like elements. It should be noted that the listing of the above types of devices 12 is given as an example and should not be seen as to limit the scope of the present invention.

The semiconductor device 10 may be a lead type of device, a Ball Grid Array (BGA) type of device, a Land Grid Array (LGA) type of device, or the like. In the embodiment depicted in FIG. 1, the semiconductor device 10 is a BGA type of package. However, this should not be seen as to limit the scope of the present invention.

The device 12 is formed on the first surface of the substrate 16. A semiconductor die 14A is coupled to the substrate 16. An adhesive layer 18 is used to couple the semiconductor die 14A to the substrate 16. The adhesive layer 18 may be an adhesive film, an epoxy, or the like. The listing of the above adhesive layers 18 should not be seen as to limit the scope of the present invention. The semiconductor die 14a is then electrically coupled to the substrate 16. The semiconductor die 14a may be coupled to the substrate 16 through the use of wirebonds. Alternatively, a flip chip may be used. A mold compound 14 is then used to encapsulate the device 12.

Electrical contacts 22 are coupled to a second surface of the substrate 16. The electrical contacts 22 are used provide an electrical connection to the stacking structure 10. The electrical contacts 22 may be a plurality of solder balls 22A as shown in FIG. 1 or a plurality of leads. If solder balls 22A are used, the solder balls 22A will be electrically coupled to the second surface of the substrate 16. In general, a reflow process may be used to couple the solder balls 22A to the second surface of the substrate 16. If leads are used, the leads are coupled to the substrate 16 in a different manner. For example, the leads may be connected by a process such as the connection of outer leads in Tape Automated Bonding (TAB). Alternative methods may be used to couple the leads to the substrate 16 without departing from the spirit and scope of the present invention.

The substrate 16 has a plurality of lands 26 formed on a top surface thereof. The lands 26 are used for stacking additional devices on the semiconductor device 10. In the prior art, a problem may arise on the first surface of the substrate 16 as the mold compound 14 may encroach on the inner row of the lands 26. Because of this problem, many stacked semiconductor packages use a solder mask defined (SMD) land pad opening on the inner row of all land pads. A SMD land pad is one where the solder mask opening is smaller than the metal of the land pads. However board level reliability is believed to be proportional to exposed land pad metal area. SMD land pads reduce the amount of exposed land pad metal areas and therefore reduce board level reliability.

Figure 2:
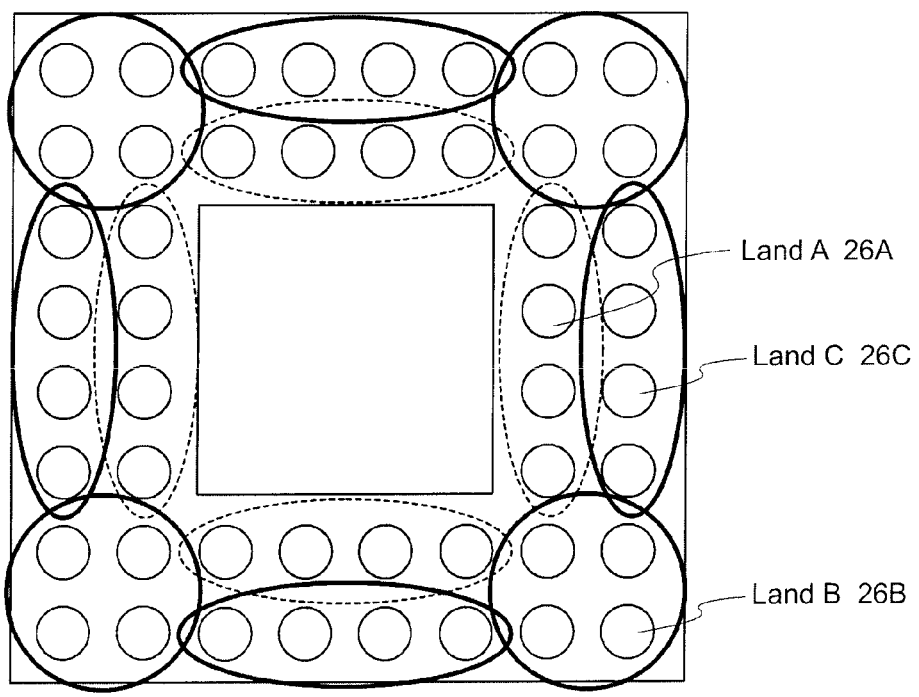
FIG. 2 is a top view of the semiconductor device of the present invention segmenting the lands.

Referring now to FIG. 2, the semiconductor device 10 provides a unique land pattern in order to overcome the above problem. The lands 26 on the top surface of the substrate 16 are placed into one of three groups based on the position of the land 26. The lands 26A around the perimeter of the device 12 and closest to the mold compound 14 are labeled as Group A.

The lands 26B located on the corner of the top surface of the substrate 16 are labeled as Group B. The remaining lands 26C are labeled as Group C.

Figure 3A:
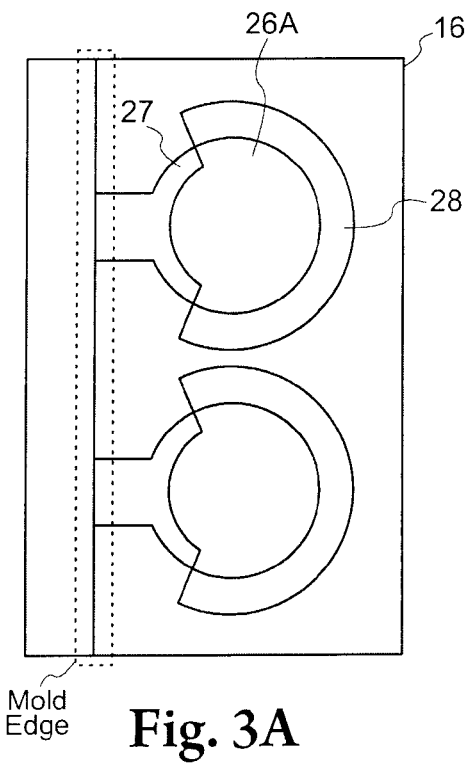
FIG. 3A is a magnified top view of one embodiment of the lands used in one of the segmented land areas.

Referring now to FIG. 3A, one embodiment of the lands 26A in Group A is shown. In order to guard against mold flash while trying to increase drop rest performance, the lands 26A in Group A are partially SMD. The area of the lands 26A in Group A closest to the device 12 will be SMD to guard against mold flash. Thus, solder mask 27 is used to cover the portions of the lands 26A closest to the device 12. The rest of the area of the lands 26A in Group A will be Non-Solder Mask Defined (NSMD). The area of the lands 26 in Group A which are NSMD will have solder mask openings that is larger than the area around the lands 26A. Thus, the area around the lands 26A that are NSMD is removed to expose metal layers 28 in the substrate 16. The area of the lands 26A in Group A that is (NSMD) will provide a larger exposed metal area thereby increasing board level reliability. In the embodiment depicted in FIG. 3A, for lands 26A in Group A, approximately one-third of the land 26A that is closest to the device 12 and hence the mold compound 14 is SMD. The remaining two-thirds of the land 26A is then NSMD. It should be noted that the above percentages are given as examples and should not be seen as to limit the scope of the present invention.

Figure 3B:
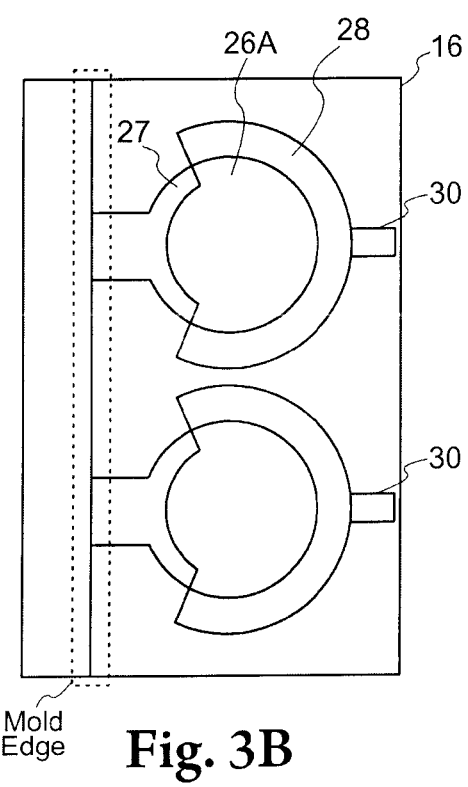
FIG. 3B is a magnified top view of another embodiment of the lands used in one of the segmented land areas.

The actual amount of area of the lands 26A of Group A that is SMD may vary. Referring to FIG. 3B, approximately one-half of the land 26A that is closest to the device 12 and hence the mold compound 14 is SMD. The remaining one-half of the land 26A is NSMD. In order to prevent metal peeling of the exposed areas of the lands 26A, anchors 30 may be used. The anchors 30 are coupled to the exposed areas of the lands 26A and to the substrate 16. The anchors 30 are generally metal anchors 30. Metal anchors 30 will not only prevent metal peeling of the lands 26A, but the metal anchors 30 will increase the surface area of the lands 26.

Figure 3C:
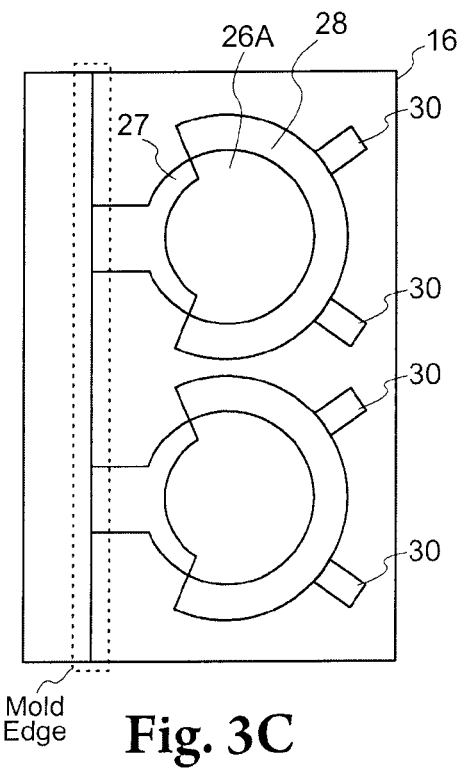
FIG. 3C is a magnified top view of another embodiment of the lands used in one of the segmented land areas.

Referring now to FIG. 3C, another embodiment of the lands 26A of Group A is shown. In this embodiment, for the lands 26A of Group A, the area of the lands 26A closest to the device 12 will be SMD to guard against mold flash. An outer area of the lands 26A furthest away from the device 12 will be NSMD. Areas on the lands 26A in between the SMD and NSMD areas will remain unchanged. In order to prevent metal peeling of the exposed areas of the lands 26A, anchors 30 may be used to coupled the exposed areas of the lands 26A to the substrate 16. The anchors 30 are generally metal anchors 30. Metal anchors 30 will not only prevent metal peeling of the lands 26A, but the metal anchors 30 will increase the surface are of the lands 26A. One or more anchors 30 may be used for each land 26A.

Figure 4A:
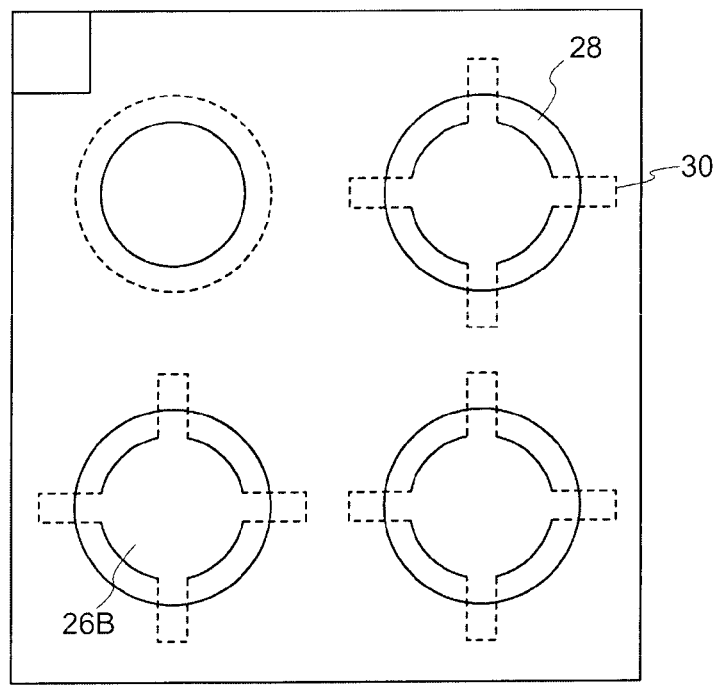
FIG. 4A is a magnified top view of the lands used in another of the segmented land areas.

Referring now to FIG. 4A, one embodiment of the lands 26B in Group B is shown. As shown in the Figure, one or more of the lands 26B are NSMD. In accordance with one embodiment of the present invention, the lands 26B around the outer perimeter of the substrate 16 are NSMD. The remaining land 26B that is not on the outer perimeter of the substrate is SMD. By having the lands 26B around the outer perimeter of the substrate as NSMD, the lands 26B will provide a larger exposed metal area thereby increasing board level reliability.

The above configuration also increases reliability when warpage occurs to the semiconductor device 10. In the Post Mold Cure (PMC) or reflow process, when the semiconductor device 10 is cooled down after heating, a warpage occurs in the semiconductor device due to a heat expansion coefficient difference between materials. When warpage occurs, the substrate 16 begins to bend upwards and has a concave appearance. When coupling another device to the top surface of the semiconductor device 10, there will be a lower gap around the outer perimeter than in the center area of the top surface due to this warpage. By having the lands 26B around the outer perimeter of the substrate as NSMD, this will provide for a lower profile of the semiconductor device 10 in these areas.

Figure 4B:
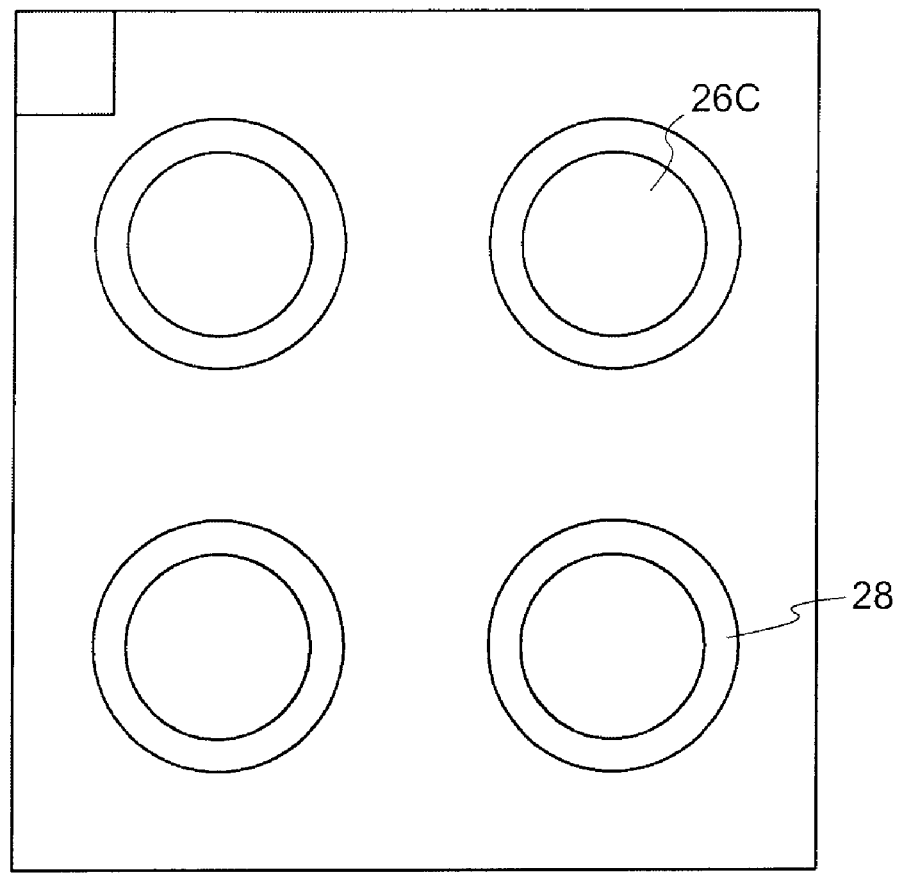
FIG. 4B is a magnified top view of another embodiment of the lands used in another of the segmented land areas.

Referring now to FIG. 4B, one embodiment of the lands 26C in Group C is shown. As shown in the Figure, the lands 26C are NSMD. By having the lands 26B around the outer perimeter of the substrate as NSMD, the lands 26B will provide a larger exposed metal area thereby increasing board level reliability. Furthermore, since the lands 26C are along the outer perimeter of the substrate 16, having the lands 26C as NSMD will increases reliability when warpage occurs to the semiconductor device 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:

a substrate;

an encapsulation area on a first surface of the substrate;

a first plurality of metal lands on the first surface of the substrate around a periphery of the encapsulation area; and solder mask covering portions of the first plurality of metal lands closest to the encapsulation area;

wherein remaining portions of the first plurality of metal lands are exposed areas having no solder mask.

2. A semiconductor device in accordance with claim 1 wherein the substrate is exposed around the first plurality of metal lands having exposed areas having no solder mask opposite the capsulation area.

3. A semiconductor device in accordance with claim 2 further comprising at least one anchor, the at least one anchor coupled to the exposed areas having no solder mask on at least one of the first plurality of metal lands and the substrate.

4. A semiconductor device in accordance with claim 1 further comprising a plurality of corner lands located in each corner of the first surface of the substrate, wherein at least one corner land in each corner of the first surface of the substrate are exposed having no solder mask.

5. A semiconductor device in accordance with claim 4 wherein the substrate is exposed around the at least one corner land exposed having no solder mask.

6. A semiconductor device in accordance with claim 5 further comprising at least one corner anchor, the at least one corner anchor coupled to exposed areas having no solder mask on at least one corner land and the substrate.

7. A semiconductor device in accordance with claim 5 further comprising at least one side anchor, the at least one side anchor coupled to exposed areas having no solder mask on at least one of the second plurality of metal lands and the substrate.

8. A semiconductor device in accordance with claim 1 further comprising a second plurality of metal lands located on an outer periphery of the substrate, wherein at least one of the second plurality of metal lands is exposed having no solder mask.

9. A semiconductor device in accordance with claim 8 wherein the substrate is exposed around the at least one of the second plurality of metal lands that is exposed having no solder mask.

10. A semiconductor device comprising:
a substrate;
an encapsulation area on a first surface of the substrate; and
a first plurality of metal lands on the first surface of the substrate around a periphery of the encapsulation area;
wherein a portion of the first plurality of metal lands closest to the encapsulation area is solder mask defined and remaining portions of the first plurality of metal lands are non-solder mask defined.

11. A semiconductor device in accordance with claim 10 further comprising at least one anchor, the at least one anchor coupled to a non-solder mask defined area of one of the first plurality of metal lands and the substrate.

12. A semiconductor device in accordance with claim 10 further comprising a plurality of corner lands located in each corner of the first surface of the substrate, wherein at least one corner land in each corner of the first surface of the substrate are non-solder mask defined.

13. A semiconductor device in accordance with claim 12 further comprising at least one corner anchor, the at least one corner anchor coupled to the at least one non-solder mask defined corner land and the substrate.

14. A semiconductor device in accordance with claim 10 further comprising a second plurality of metal lands located on an outer periphery of the substrate, wherein at least one of the second plurality of metal lands is non-solder mask defined.

15. A semiconductor device in accordance with claim 14 further comprising at least one side anchor, the at least one side anchor coupled to the at least one of the second plurality of metal lands that are non-solder mask defined.

16. A semiconductor device comprising:
a substrate;
an encapsulation area on a first surface of the substrate;
a first plurality of metal lands on the first surface of the substrate around a periphery of the encapsulation area;
solder mask covering portions of the first plurality of metal lands closest to the encapsulation area, remaining portions of the first plurality of metal lands are exposed areas having no solder mask; and
at least one anchor, the at least one anchor coupled to exposed areas having no solder mask on at least one of the first plurality of metal lands and the substrate;
wherein the substrate is exposed around the first plurality of metal lands having exposed areas having no solder mask opposite the encapsulation area.

17. A semiconductor device in accordance with claim 16 further comprising a plurality of corner lands located in each corner of the first surface of the substrate, wherein at least one corner land in each corner of the first surface of the substrate are exposed having no solder mask.

18. A semiconductor device in accordance with claim 17 further comprising at least one corner anchor, the at least one corner anchor coupled to exposed areas having no solder mask on at least one corner land and the substrate.

19. A semiconductor device in accordance with claim 16 further comprising a second plurality of metal lands located on an outer periphery of the substrate, wherein at least one of the second plurality of metal lands is exposed having no solder mask.

20. A semiconductor device in accordance with claim 19 further comprising at least one side anchor, the at least one side anchor coupled to exposed areas having no solder mask on at least one of the second plurality of metal lands and the substrate.

* * * * *